(12) United States Patent
Tilton et al.

(10) Patent No.: US 7,372,698 B1
(45) Date of Patent: May 13, 2008

(54) ELECTRONICS EQUIPMENT HEAT EXCHANGER SYSTEM

(75) Inventors: Donald E. Tilton, Liberty Lake, WA (US); Howard L. Davidson, San Carlos, CA (US); Nyles I. Nettleton, Campbell, CA (US)

(73) Assignee: Isothermal Systems Research, Inc., Liberty Lake, WA (US)

( * ) Notice: Subject to any disclaimer, the term of this patent is extended or adjusted under 35 U.S.C. 154(b) by 0 days.

(21) Appl. No.: 11/614,483

(22) Filed: Dec. 21, 2006

(51) Int. Cl.
*H05K 7/00* (2006.01)
*F28D 15/00* (2006.01)

(52) U.S. Cl. ............ 361/701; 361/696; 361/698; 361/699; 361/700; 361/702; 165/80.4; 165/80.5; 165/104.33

(58) Field of Classification Search ........ 361/687–689, 361/696–703, 720; 165/80.4–80.5, 104.33, 165/908
See application file for complete search history.

(56) References Cited

U.S. PATENT DOCUMENTS

| | | | | |
|---|---|---|---|---|
| 5,285,347 A | * | 2/1994 | Fox et al. ................... | 361/699 |
| 6,571,569 B1 | * | 6/2003 | Rini et al. .................. | 62/259.2 |
| 6,989,990 B2 | * | 1/2006 | Malone et al. .............. | 361/699 |
| 6,993,926 B2 | * | 2/2006 | Rini et al. .................. | 62/259.2 |
| 6,997,247 B2 | * | 2/2006 | Malone et al. .............. | 165/150 |
| 7,002,799 B2 | * | 2/2006 | Malone et al. .............. | 361/699 |
| 7,123,479 B2 | * | 10/2006 | Chang et al. ............... | 361/700 |
| 7,149,084 B2 | * | 12/2006 | Matsushima et al. ....... | 361/699 |
| 7,203,063 B2 | * | 4/2007 | Bash et al. ................. | 361/699 |
| 7,280,358 B2 | * | 10/2007 | Malone et al. .............. | 361/701 |
| 7,283,360 B2 | * | 10/2007 | Chang et al. ............... | 361/701 |
| 2007/0125523 A1 | * | 6/2007 | Bhatti et al. ........... | 165/104.33 |

\* cited by examiner

*Primary Examiner*—Jayprakash Gandhi
*Assistant Examiner*—Robert J Hoffberg
(74) *Attorney, Agent, or Firm*—Michael S. Neustel

(57) ABSTRACT

An electronics equipment heat exchanger system for thermally managing the electronic devices of a computer server and the exhaust air emitted from the computer server. The electronics equipment heat exchanger system generally includes a heat exchanger attached near an air outlet of a support unit for a support rack, a thermal management unit fluidly connected to the heat exchanger, and a thermal conditioning unit fluidly connected to the thermal management unit and the heat exchanger. The thermal management unit directly thermally manages one or more electronic devices of the server mainboard while the heat exchanger thermally manages the exhaust air before the exhaust air exits through the outlet of the support unit of the computer server.

20 Claims, 10 Drawing Sheets

ELECTRONICS EQUIPMENT HEAT EXCHANGER SYSTEM

CROSS REFERENCE TO RELATED APPLICATIONS

Not applicable to this application.

STATEMENT REGARDING FEDERALLY SPONSORED RESEARCH OR DEVELOPMENT

Not applicable to this application.

BACKGROUND OF THE INVENTION

1. Field of the Invention

The present invention relates generally to server room thermal management devices and more specifically it relates to an electronics equipment heat exchanger system for thermally managing the electronic devices of a computer server and the exhaust air emitted from the computer server.

2. Description of the Related Art

Any discussion of the prior art throughout the specification should in no way be considered as an admission that such prior art is widely known or forms part of common general knowledge in the field.

A server room is comprised of one or more computer servers used by a company to perform various functions (e.g. web hosting, cluster computing). Some server rooms are comprised of a "server farm" which includes a significant number of computer servers (e.g. 100, 500, 1,000). Performance in any computer server is typically limited by the performance of the server room's cooling systems rather than by the performance of the computer servers. The design of the server room is important to ensure that heat generated by the computer servers is efficiently removed which includes thermally managing the electronic components directly and by thermally managing the air within the server room through an HVAC system.

Liquid thermal management systems are becoming the desired choice to thermally manage the computer servers within a server room. Single-phase liquid thermal management systems (e.g. liquid cold plates) and multi-phase liquid thermal management systems (e.g. spray cooling, pool boiling, flow boiling, jet impingement cooling, falling-film cooling, parallel forced convection, curved channel cooling and capillary pumped loops) have been in use for years for thermally managing various types of heat producing devices. Spray cooling technology is being adopted today as the most efficient option for thermally managing electronic systems. U.S. Pat. No. 5,220,804 entitled High Heat Flux Evaporative Spray Cooling to Tilton et al. describes the earlier versions of spray technology. U.S. Pat. No. 6,108,201 entitled Fluid Control Apparatus and Method for Spray Cooling to Tilton et al. also describes the usage of spray technology to cool a printed circuit board.

One problem with conventional server room thermal management systems is that the HVAC systems are typically designed to support only up to a pre-specified number of watts per square foot (e.g. 100 watts per square foot) a formula which makes it difficult to anticipate (1) future additions of computer servers and (2) future advances in computer servers that produce increased heat. In addition, while liquid thermal management systems are highly efficient in removing heat from computer services, they do not remove all heat generated by a computer server (e.g. from the non-liquid cooled components) thereby still requiring an efficient air conditioning system to maintain a desired air temperature within the server room. If the HVAC system cannot thermally manage the air within the server room, then additional computer servers cannot be added to the server room when space is available.

Because of the costs and difficulties of maintaining a server room with a larger number of computer servers at a desired average room temperature, there is a need for efficiently thermally managing the electronic components within a computer server and the surrounding air.

BRIEF SUMMARY OF THE INVENTION

The general purpose of the present invention is to provide an electronics equipment heat exchanger system that has many of the advantages of the server room thermal management devices mentioned heretofore. The invention generally relates to a server room thermal management devices which includes a heat exchanger attached near an air outlet of a support unit for a support rack, a thermal management unit fluidly connected to the heat exchanger, and a thermal conditioning unit fluidly connected to the thermal management unit and the heat exchanger. The thermal management unit directly thermally manages one or more electronic devices of the server mainboard while the heat exchanger thermally manages the exhaust air before the exhaust air exits through the outlet of the support unit of the computer server.

There has thus been outlined, rather broadly, some of the features of the invention in order that the detailed description thereof may be better understood, and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction or to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

An object is to provide an electronics equipment heat exchanger system for thermally managing the electronic devices of a computer server and the exhaust air emitted from the computer server.

Another object is to provide an electronics equipment heat exchanger system that may be utilized in various scaled server rooms such as but not limited to server farms.

An additional object is to provide an electronics equipment heat exchanger system that reduces the thermal management requirements for a server room HVAC system.

A further object is to provide an electronics equipment heat exchanger system that provides for increased thermal management of the air within a server room.

Other objects and advantages of the present invention will become obvious to the reader and it is intended that these objects and advantages are within the scope of the present invention. To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

Figure 1:
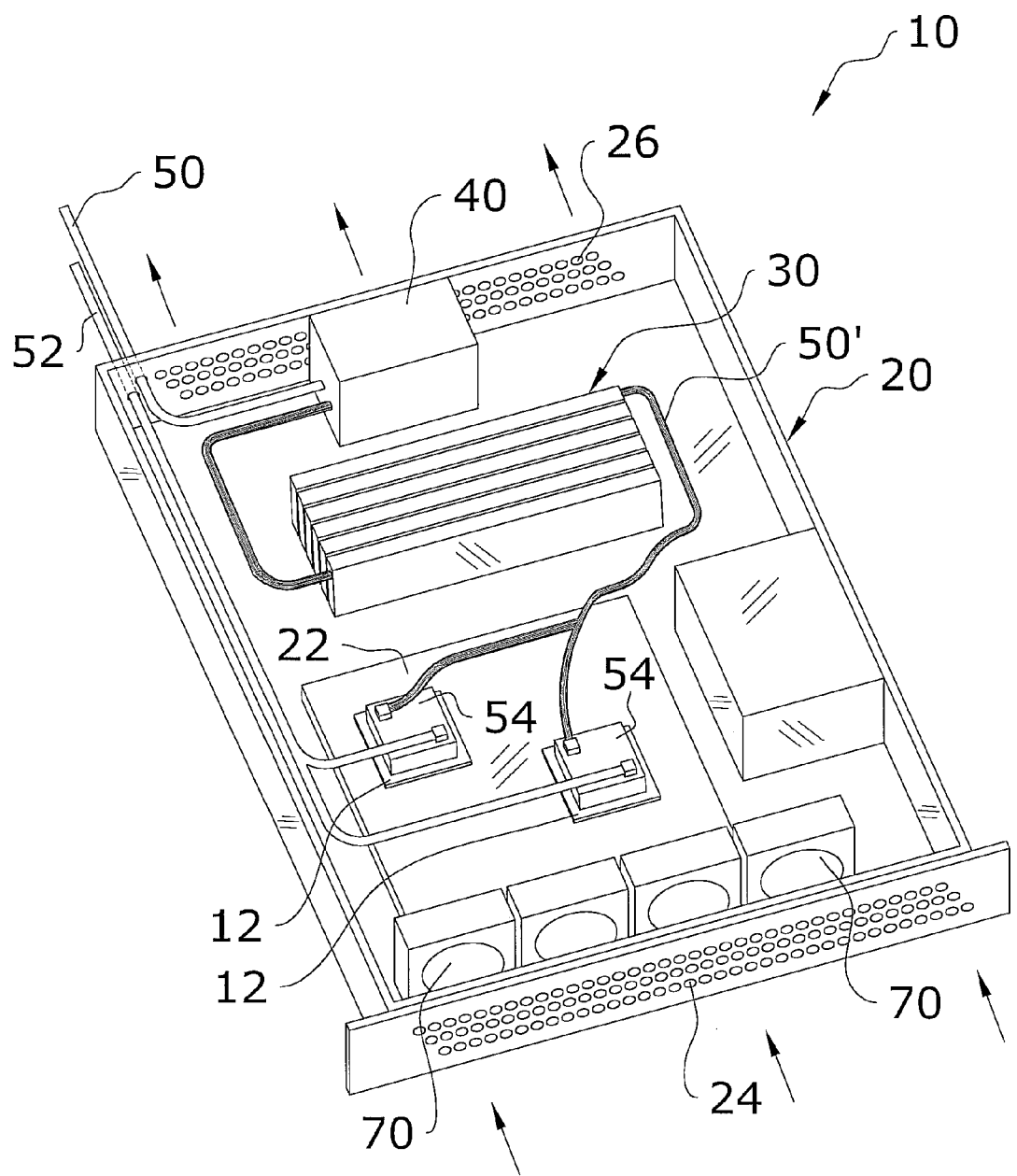
FIG. 1 is an upper perspective view of a support unit for a server rack illustrating the overall structure of the present invention.

Turning now descriptively to the drawings, in which similar reference characters denote similar elements throughout the several views, FIGS. 1 through 9 illustrate an electronics equipment heat exchanger system 10, which comprises a heat exchanger 30 attached near an air outlet 26 of a support unit 20 for a support rack 60, a thermal management unit 54 fluidly connected to the heat exchanger 30, and a thermal conditioning unit 56 fluidly connected to the thermal management unit 54 and the heat exchanger 30. The thermal management unit 54 directly thermally manages one or more electronic devices of the server mainboard 22 while the heat exchanger 30 thermally manages the exhaust air before the exhaust air exits through the outlet of the support unit 20 of the computer server.

B. Support Rack

Figure 5:
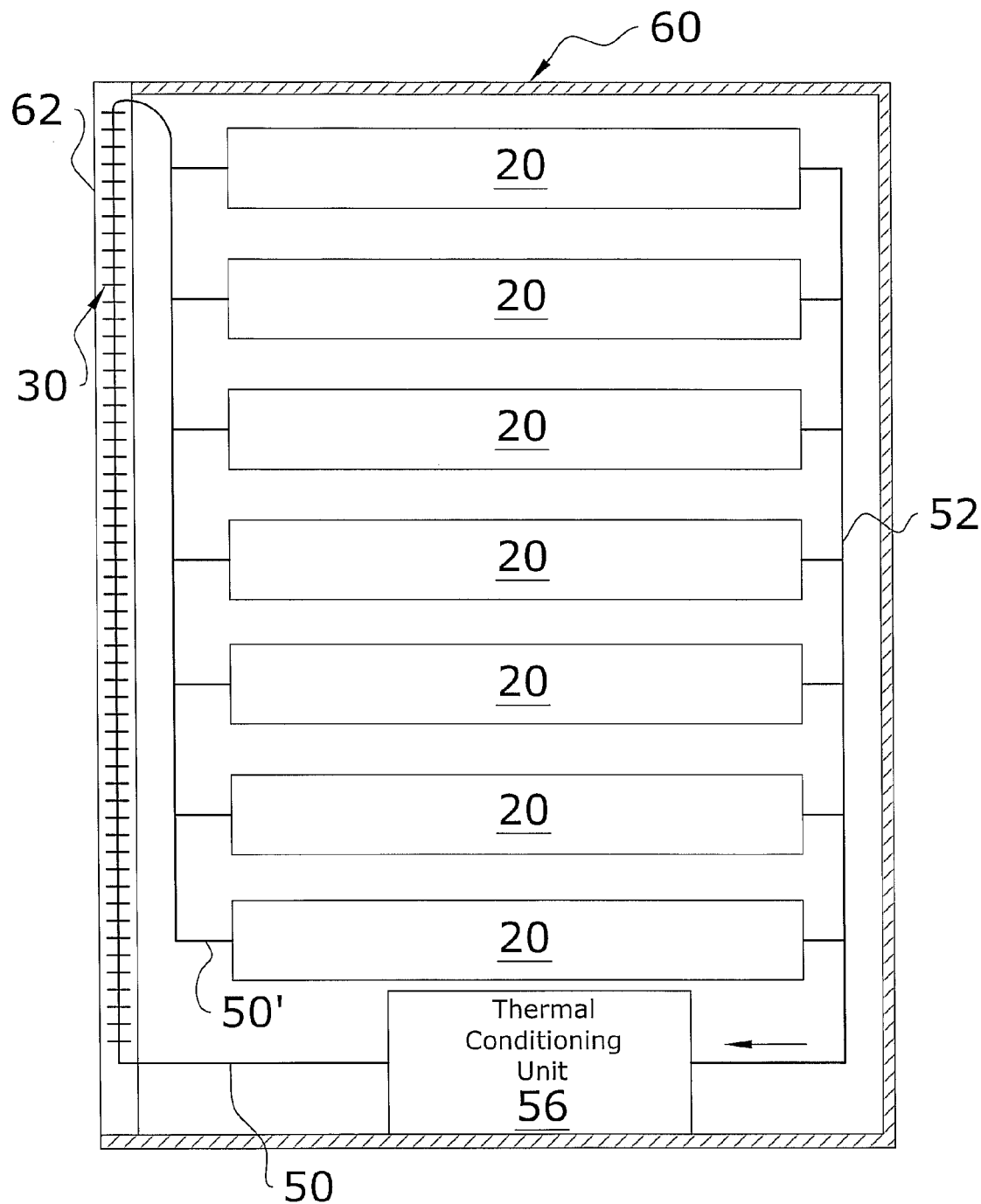
FIG. 5 is a side view of another alternative embodiment with the heat exchanger positioned within the door of a support rack.

FIG. 5 illustrates an exemplary support rack 60. The support rack 60 may be comprised of various types of structures capable of supporting one or more computer servers (or other electronic devices) such as but not limited to server cabinets, server racks, wall mount racks, network racks, computer cabinets and the like.

The support rack 60 may be comprised of a relatively enclosed structure that includes at least one opening to allow air to flow in and out of the support rack 60 to remove heat from within the support rack 60. The support rack 60 may also be comprised of a relatively open structure.

At least one support unit 20 is preferably attached within the support rack 60 to support the computer server as illustrated in FIGS. 1 through 5 of the drawings. The support unit 20 receives and supports the computer server as is well known in the art of computer servers. The support unit 20 may be comprised of various support structures such as a shelf, sliding tray and the like. The support unit 20 is preferably removably attached within the support rack 60 to allow for repairs and modification of the computer server.

The support unit 20 includes an air inlet 24 to allow air to enter the support unit 20 and an air outlet 26 to allow air to exit the support unit 20 as best illustrated in FIG. 1 of the drawings. The air inlet 24 and the air outlet 26 are preferably comprised of a plurality of apertures, however a single aperture may also be used.

Figure 2:
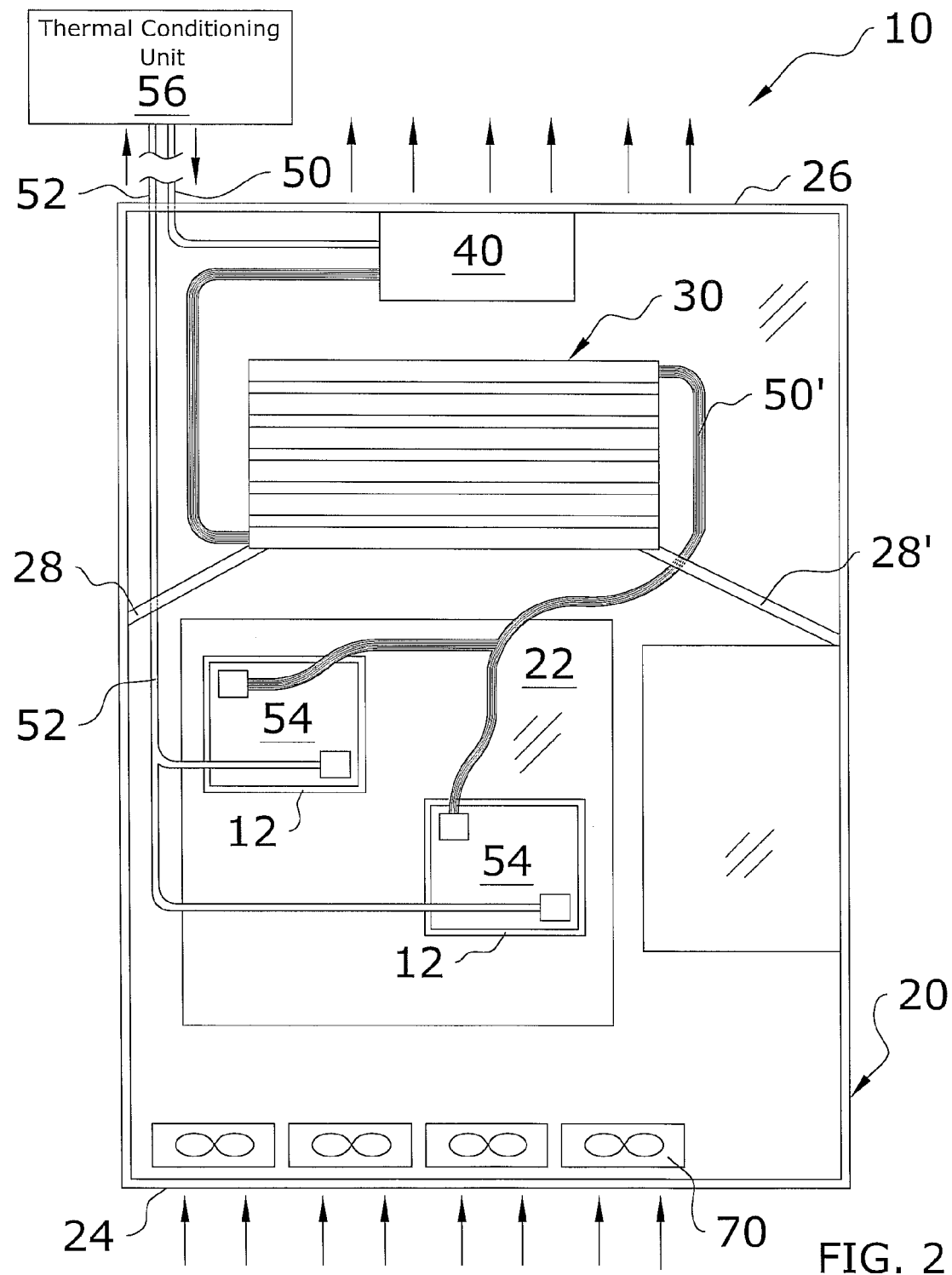
FIG. 2 is a top view of the support unit for a server rack illustrating the overall structure of the present invention.

A server mainboard 22 is preferably attached to the support unit 20 as illustrated in FIGS. 1 and 2 of the drawings. The server mainboard 22 may be comprised of any conventional server mainboard 22 utilized in computer servers. In addition, various other electronic devices and other heat producing devices 12 may be attached to the support unit 20. It should be appreciated that the present invention is not limited for use with respect to only a computer server and that it may be utilized with many other electronic devices (e.g. other computer types, packet switch, router, display, disk drive, etc.).

It is preferable to have an air moving device 70 attached to the support unit 20 to move outside air through the air inlet 24 and through the air outlet 26 of the support unit 20. The air moving device 70 is comprised of a unit capable of moving air from one location to another. The air moving device 70 may also be positioned externally of the support unit 20. The air moving device 70 is preferably positioned near the air inlet 24 however the air moving device 70 may be positioned near the air outlet 26 or other locations within the support unit 20.

The air moving device 70 is preferably comprised of a fan or similar device. As further shown in FIGS. 1 through 4 of the drawings, a plurality of fans may be positioned near the air inlet 24 to move the air within the support unit 20.

C. Heat Exchanger

FIGS. 1 through 4 illustrate exemplary heat exchangers 30. The heat exchanger 30 is comprised of a unit capable of transferring heat from air to liquid coolant flowing through the heat exchanger 30.

Figure 6:
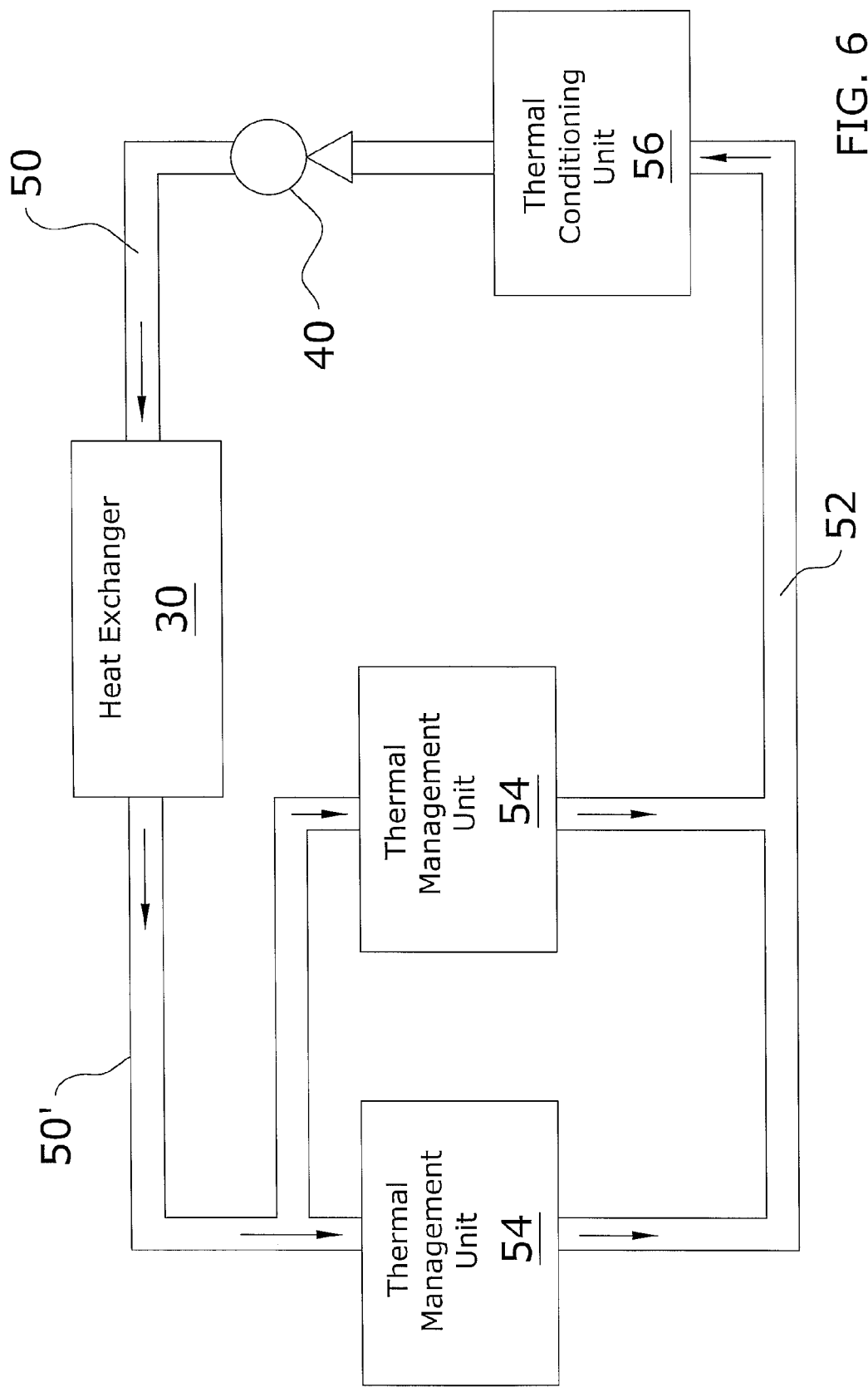
FIG. 6 is a block diagram illustrating the overall liquid coolant flow of the present invention.
Figure 8:
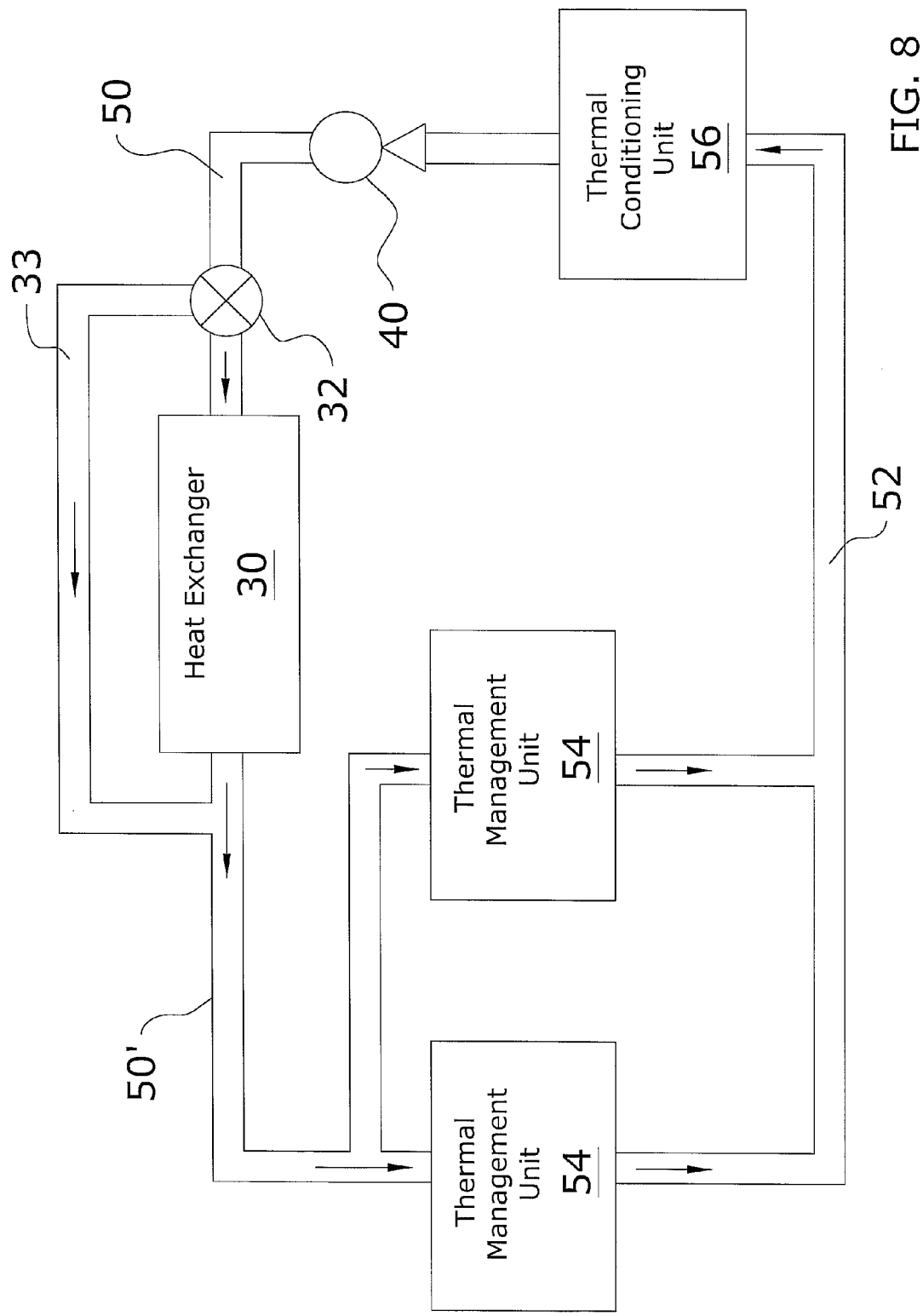
FIG. 8 is a block diagram illustrating an alternative embodiment utilizing a valve to control the flow of liquid coolant through the heat exchanger.

The heat exchanger 30 includes an inlet that is fluidly connected to a pump 40 which is fluidly connected to a thermal conditioning unit 56 thereby providing thermally conditioned coolant (i.e. cooled coolant) to the heat exchanger 30 as shown in FIGS. 2 and 6, 8 of the drawings. The heat exchanger 30 further includes an outlet that is fluidly connected to the thermal management unit 54 as shown in FIGS. 2 and 6, 8 of the drawings.

The heat exchanger 30 is preferably positioned within the support unit 20 to thermally condition heated air within the support unit 20 before the heated air exits through the air outlet 26 as shown in FIGS. 1 through 4 of the drawings. However, the heat exchanger 30 may be positioned externally of the support unit 20 to provide a global thermal management of heated exhaust air such as within the door 62 of the support rack 60 as shown in FIG. 5 of the drawings.

The heat exchanger 30 preferably is sized to ensure that the air heated by the heat producing devices 12 (e.g. electronic components, heat sinks, etc.) is thermally managed to a desirable temperature (e.g. at or below that of the room temperature) before exiting to the room surrounding the support rack 60. For example, the heat exchanger 30 preferably extends across at least fifty-percent of a width of the support unit 20 to ensure a significant portion of the heated air within the support unit 20 passes through the heat exchanger 30 prior to exiting.

As shown in FIG. 2 of the drawings, baffles 28, 28' are preferably utilized to direct the air flow through the heat exchanger 30 to prevent the air from flowing around the heat exchanger 30. The baffles 28, 28' extend from the side walls of the support unit 20 to direct the air through the heat exchanger 30. The baffles 28, 28' preferably extend from at least one side of the heat exchanger 30 to an inner wall of the support unit 20 as further shown in FIG. 2 of the drawings.

The size of the heat exchanger 30 further is determined by log average temperature difference between the air and the coolant, flow rates, internal and external fin surface areas. For example, one embodiment of the heat exchanger 30 is comprised of a 3 inch high by 12 inch wide projected area that is able to transfer 1.5 kW.

The thermal management of the heated air involves conducting the heat within the air and transferring the heat to the liquid coolant passing through the heat exchanger 30 thereby reducing the temperature of the air. The heat exchanger 30 may cover the entire cross section of the support unit 20 to ensure thermal management of the heated air before it leaves the support unit 20.

The heat exchanger 30 is preferably aligned with the server mainboard 22 so that the movement of the air within the support unit 20 passes over the server mainboard 22 and to the heat exchanger 30 as best illustrated in FIG. 2 of the drawings. The heated air passes through the heat exchanger 30 and then through the air outlet 26.

The heat exchanger 30 is preferably positioned near the air outlet 26 of the support unit 20 as best illustrated in FIGS. 1 and 2 of the drawings. The heat exchanger 30 is further preferably positioned substantially transverse with respect to the flow of air within the support unit 20 as shown in FIGS. 1 and 2 of the drawings.

Figure 3:
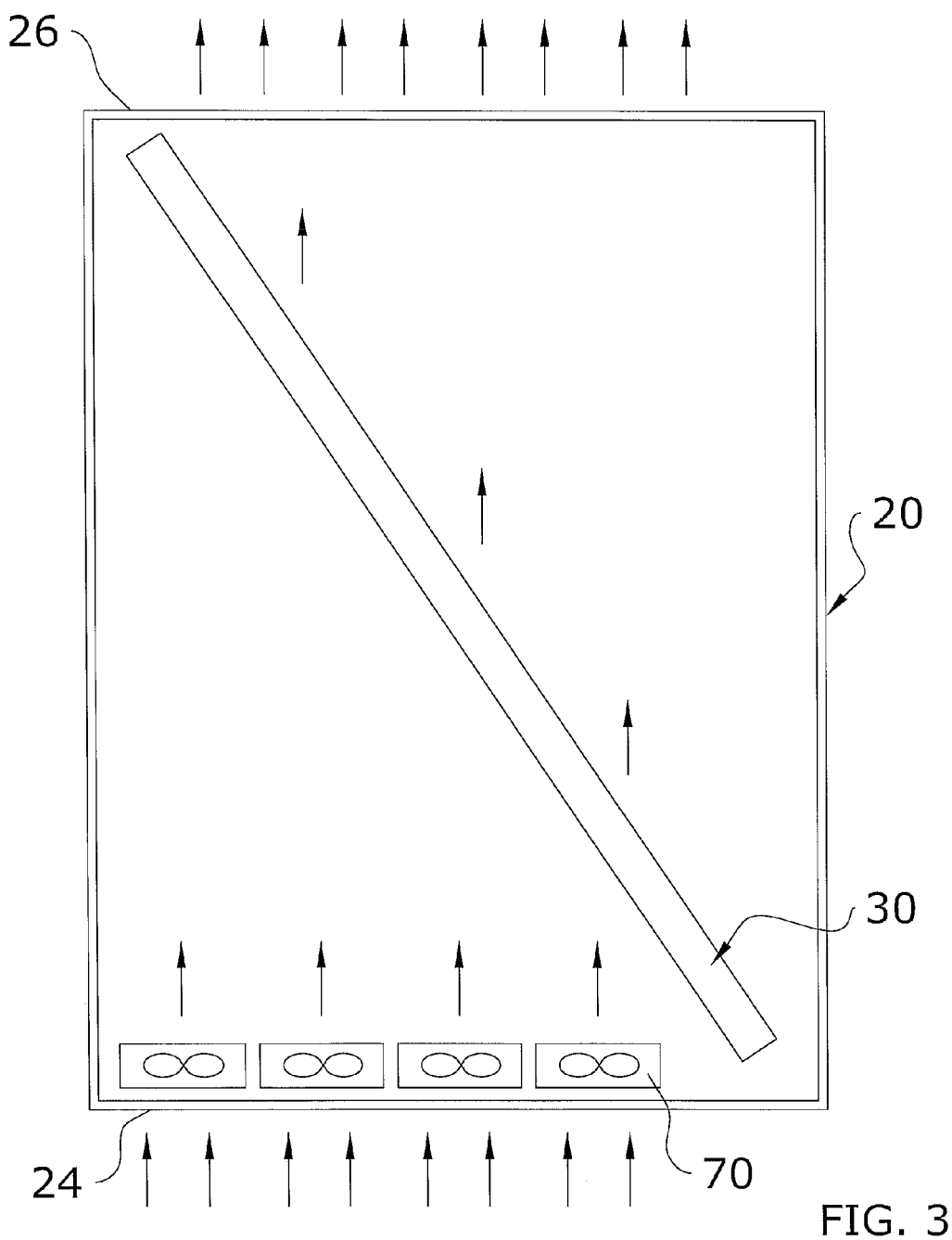
FIG. 3 is a top view of an alternative embodiment for the heat exchanger having a diagonal pattern.

In an alternative embodiment illustrated in FIG. 3 of the drawings, the heat exchanger 30 may be diagonally positioned within the support unit 20. As further shown in FIG. 3, the heat exchanger 30 has a first end positioned near the air inlet 24 and a second end positioned near the air outlet 26 of the support unit 20 while covering a substantial portion of the width of the support unit 20.

Figure 4:
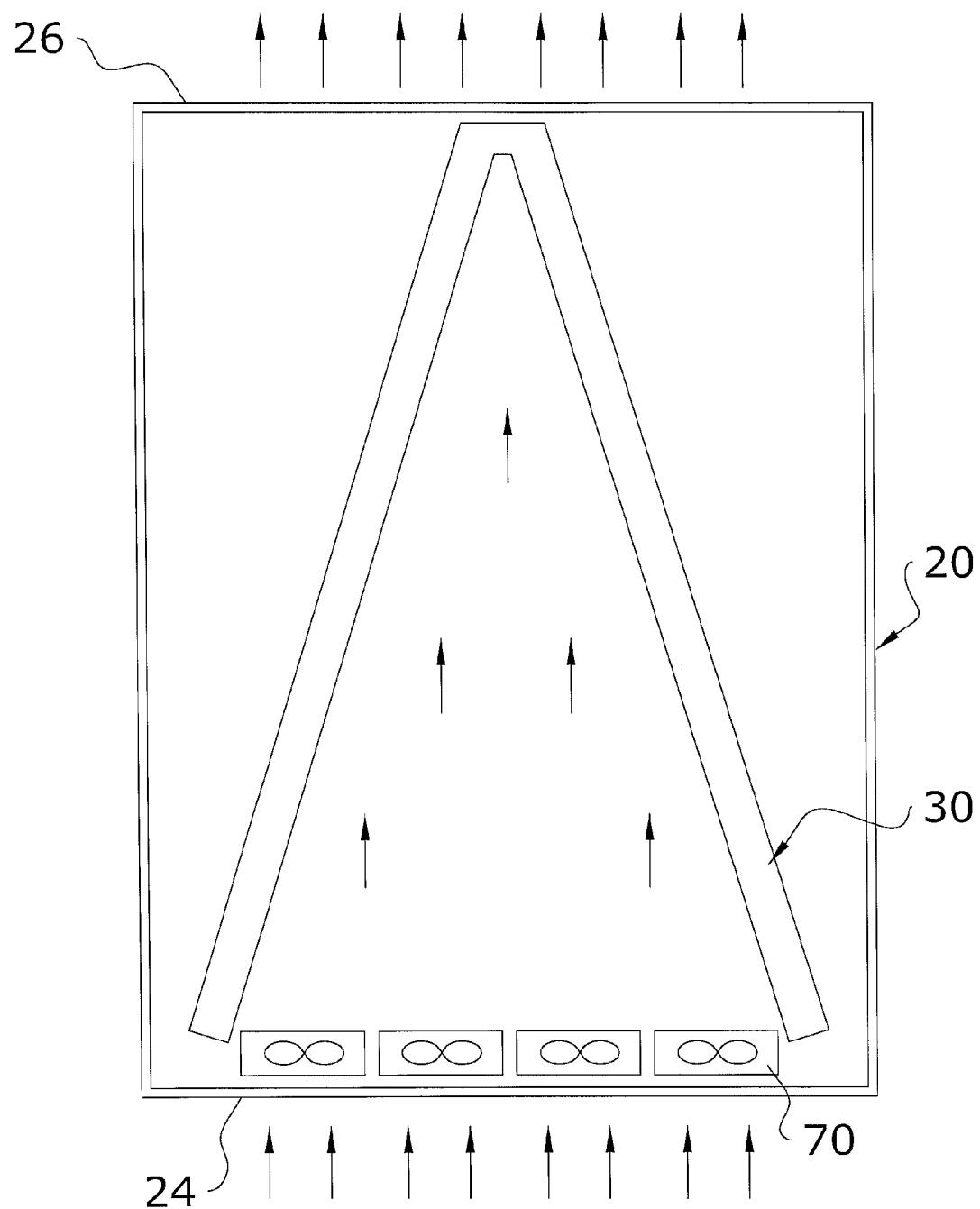
FIG. 4 is a top view of another alternative embodiment for the heat exchanger having a V-shaped pattern.

In another alternative embodiment illustrated in FIG. 4 of the drawings, the heat exchanger 30 is comprised of a V-shaped structure. The V-shaped structure may be configured with the open end facing the air inlet 24 as shown in FIG. 4 or with the open end facing the air outlet 26 (not shown).

FIG. 8 illustrates an alternative embodiment utilizing a bypass valve 32 to control the flow of liquid coolant through the heat exchanger 30 based upon the incoming air temperature and/or the exhaust air temperature. The bypass valve 32 is capable of completely diverting or partially diverting the flow of coolant to the heat exchanger 30 by diverting the coolant through the bypass line 33 as shown in FIG. 8.

Figure 9:
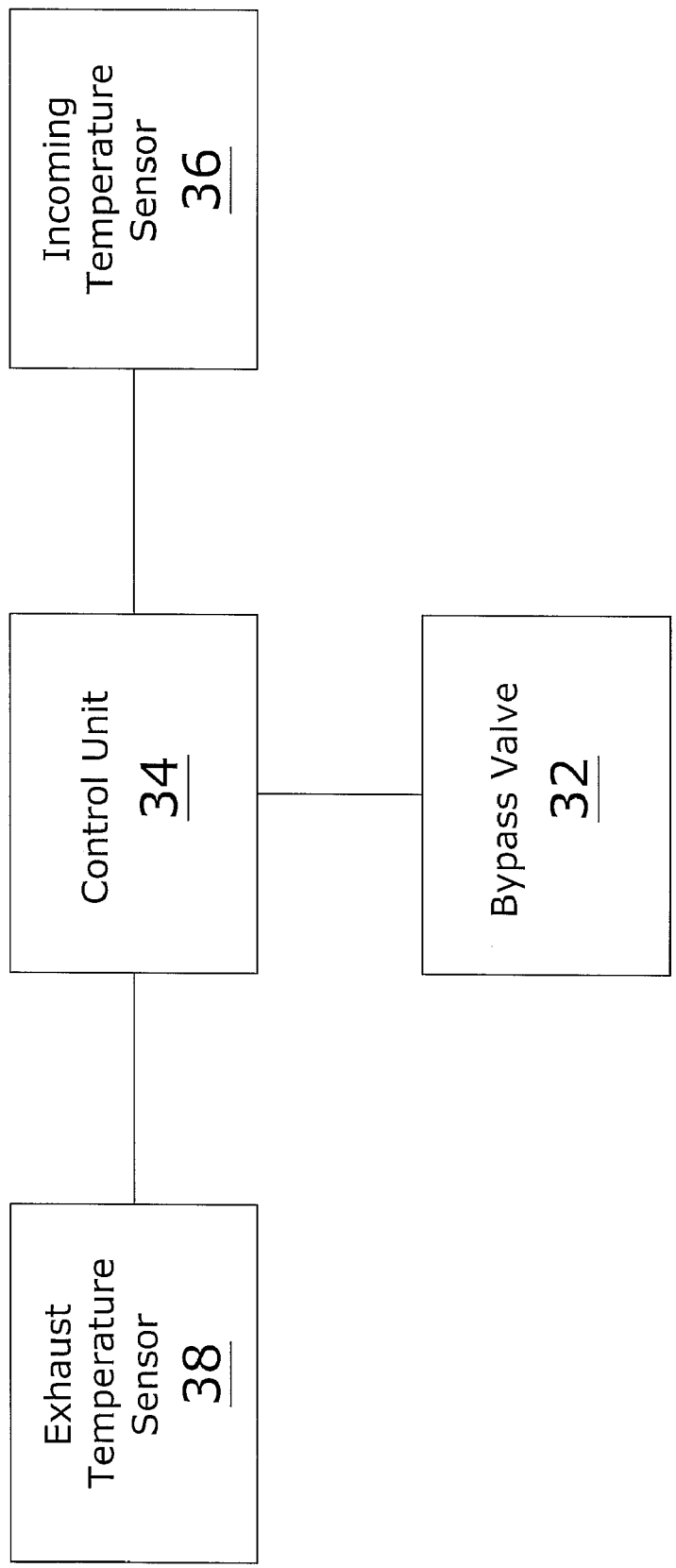
FIG. 9 is a block diagram illustrating the communications between the electrical components of the alternative embodiment illustrated in FIG. 8.

As shown in FIG. 9, a control unit 34 is in communication with the bypass valve 32 to control the bypass valve 32. The control unit 34 receives incoming air temperature information from an incoming temperature sensor 36 and exhaust air temperature information from an exhaust temperature sensor 38 as further shown in FIG. 9 of the drawings. The incoming air (usually the air from the room) is the air entering the support unit 20 and the exhaust air is the air leaving the support unit 20. The bypass valve 32 diverts the flow of the liquid coolant around the heat exchanger 30 through the bypass line 33 when thermal conditioning of the exhaust air is not required (e.g. during server computer startup; when the room temperature is below a desired level; when the exhaust air is below a desired temperature). Bypassing the heat exchanger 30 reduces the amount of work required by the pump 40 because the pressure drop across the heat exchanger 30 is removed.

In another alternative embodiment of the present invention, a movable duct or louvers is positioned within the support unit 20 to direct air away from the heat exchanger 30 thereby reducing the amount of work required by the air moving devices 70. The movable duct or louvers are mechanically manipulated by an actuator that is in communication with the control unit 34. The movable duct or louvers divert the flow of the air around the heat exchanger 30 when thermal conditioning of the exhaust air is not required as discussed previously.

Figure 10:
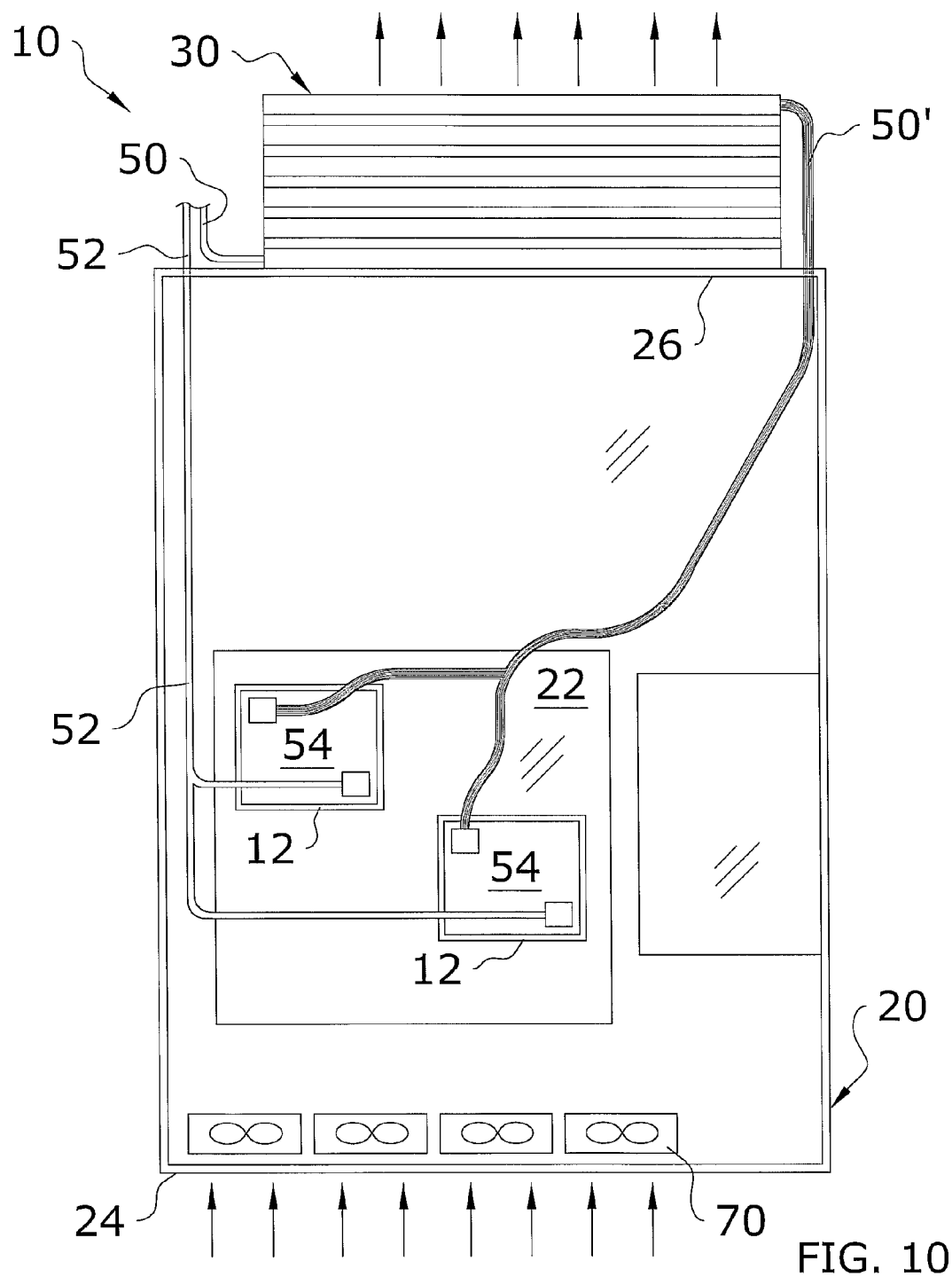
FIG. 10 is a top view of another alternative embodiment with the heat exchanger positioned adjacent to the air outlet of the support unit.

FIG. 10 illustrates another alternative embodiment where the heat exchanger 30 is positioned adjacent to the air outlet 26 of the support unit 20. The heat exchanger 30 is attached to the support unit 20 to ensure that at least a significant percentage of the air flow through the air outlet 26 passes through the heat exchanger 30. The heat exchanger 30 preferably extends across the length of the air outlet 26 to encase a significant portion of the apertures within the air outlet 26 (preferably all of the apertures). The heat exchanger 30 may be attached on the inside of the support unit 20 or the outside of the support unit 20. In addition, the heat exchanger 30 may be directly attached to the fan exhaust port of an existing computer chassis as illustrated in FIG. 10 of the drawings.

D. Liquid Thermal Management Unit

As shown in FIGS. 1, 2, 6 and 8 of the drawings, a liquid thermal management unit 54 is fluidly connected to the outlet of the heat exchanger 30 by a supply line 50' to receive the liquid coolant after the liquid coolant has conducted a portion of the heat from the heated air passing through the heat exchanger 30. The liquid thermal management unit 54 thermally manages at least one heat producing device 12 (e.g. microprocessor) on the server mainboard 22 or another heat producing device 12 on the support unit 20.

The liquid thermal management unit 54 may be comprised of a single-phase liquid cooling technology (e.g. liquid cold plates) and a multi-phase liquid cooling technology (e.g. spray cooling, pool boiling, flow boiling, jet impingement cooling, falling-film cooling, parallel forced convection, curved channel cooling and capillary pumped loops). Spray cooling technology is being adopted today as the most efficient option for thermally managing electronic systems and is preferable for use in the present invention. U.S. Pat. No. 5,220,804 entitled High Heat Flux Evaporative Spray Cooling to Tilton et al. describes the earlier versions of spray technology and U.S. Pat. No. 6,108,201 entitled Fluid Control Apparatus and Method for Spray Cooling to Tilton et al. also describes the usage of spray technology to cool a printed circuit board which are both hereby incorporated by reference herein.

The usage of multi-phase spray cooling in the present invention is particularly beneficial because the heat exchanger 30 increases the temperature of the liquid coolant to a more desirable level prior to the liquid coolant being sprayed upon the heat producing device 12. The increased temperature of the liquid coolant ensures that a desirable and efficient phase change occurs (i.e. liquid coolant converted to vaporized coolant) compared to if the liquid coolant enters the thermal management unit 54 at a temperature significantly below the phase change temperature.

A pump 40 is preferably fluidly positioned between the thermal conditioning unit 56 and the heat exchanger 30 to move the liquid coolant within the present invention as shown in FIGS. 1, 2 and 6 of the drawings. The pump 40 may be positioned in other locations within the system where it is capable of moving the liquid coolant such as within the thermal conditioning unit 56.

Figure 7:
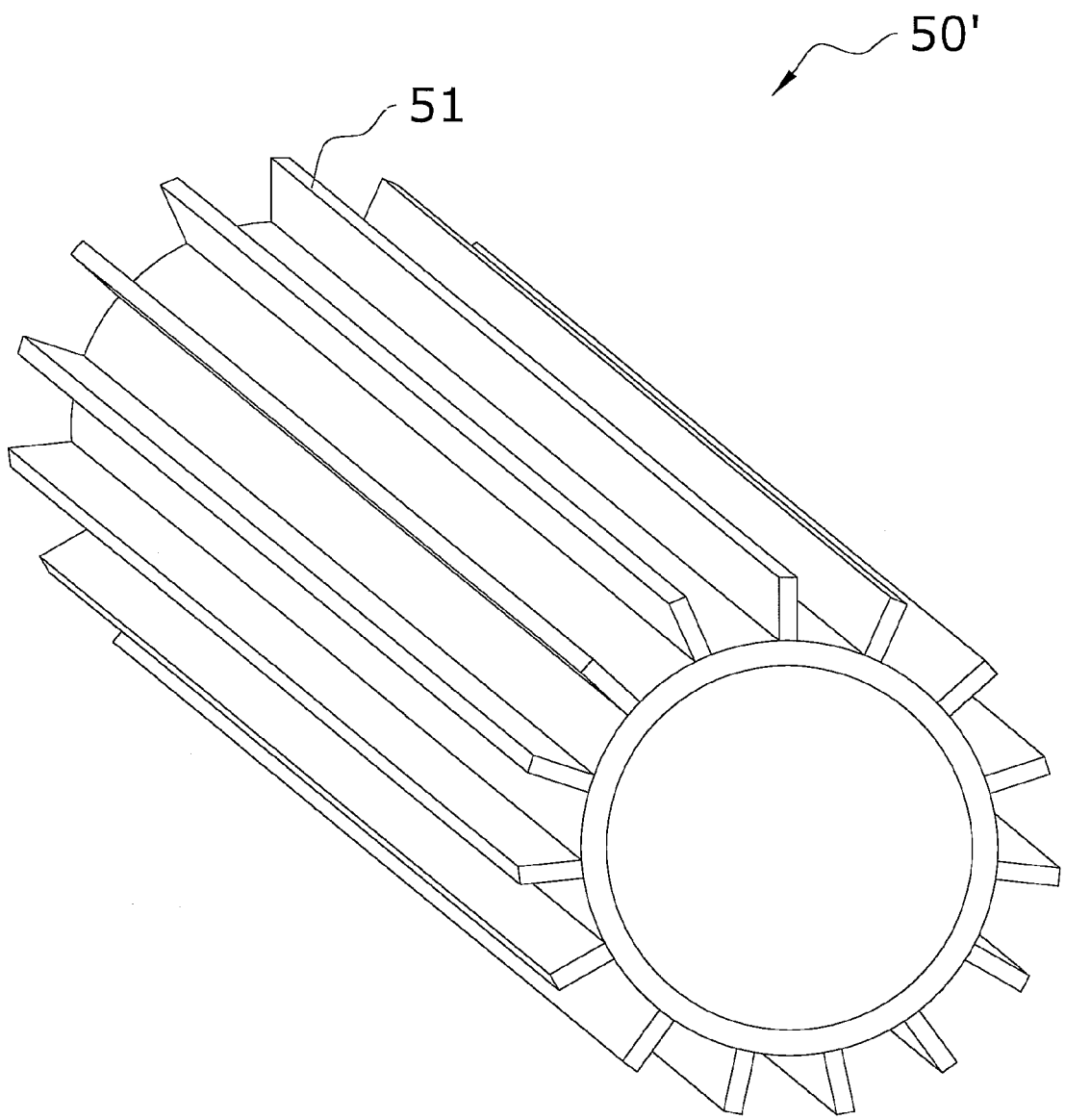
FIG. 7 is an upper perspective view of a portion of the supply line including a plurality of heat spreaders attached thereto.

As shown in FIG. 7 of the drawings, the supply line 50' preferably includes a plurality of heat spreaders 51 that conduct heat from the air moved by the air moving device 70 to increase the temperature of the liquid coolant passing through the supply line 50'. The heat spreaders 51 are preferably comprised of a plurality of fins that extend longitudinally along the length of the supply line 50' as further shown in FIG. 7, but can be of any type surface enhancement, pin fin, folded fins, surface dimple, carbon foam and the like. Alternatively, the supply line 50' or the coolant could be in direct contact with the electronic device within the support unit 20 instead of utilizing heat spreaders 51 to preheat the coolant.

E. Thermal Conditioning Unit

A thermal conditioning unit 56 is fluidly connected to the inlet of the heat exchanger 30 via a supply line 50 to provide thermally conditioned liquid coolant to the heat exchanger 30. The thermally conditioned liquid coolant conducts the heat within the heat exchanger 30 from the heated air before entering the liquid thermal management unit 54 to thermally manage a heat producing device 12.

The thermal conditioning unit 56 is further preferably fluidly connected to an exhaust port of the liquid thermal management units 54 via a return line 52 to receive the heated exhaust coolant. The thermal conditioning unit 56 cools the exhaust coolant to a desired temperature before returning the coolant to the heat exchanger 30 in a looped manner.

The thermal conditioning unit 56 is preferably positioned externally of the support rack 60 (e.g. outside of the server room, outside of the building). The thermal conditioning unit 56 may be positioned within the support rack 60 as shown in FIG. 5 of the drawings, however the heat removed from the coolant is transferred outside of the server room utilizing conventional heat transfer technologies.

F. Operation

In use, the computer servers are operated and the liquid thermal management system is operated to thermally manage the computer servers. The air moving devices 70 draw air into the air inlet 24 and over the heat producing devices 12 that are not thermally managed by the liquid thermal management units 54. The air is heated and continues to pass towards the heat exchanger 30.

The heat exchanger 30 conducts heat from the air passing through the heat exchanger 30 thereby transferring the heat to the liquid coolant passing through the heat exchanger 30. The air incurs a reduction in temperature and then continues to pass through the air outlet 26 before returning to the server room. In an alternative embodiment, a return duct (not shown) can be used to circulate the air within the support unit 20 so the air does not enter the surrounding room or the support unit 20 can be completely sealed to prevent the escape of air.

During the operation of the present invention, the liquid coolant in the heat exchanger 30 is increased in temperature by the conducting of the heat of the air and then continues through the supply line 50' where additional heat is conducted by the heat spreaders 51 of the supply line 50'. The liquid coolant then is sprayed or otherwise applied in a thermally managing manner to the heat producing device 12 thermally connected to the liquid thermal management unit 54. The liquid coolant applied to the heat producing device 12 is heated and incurs a partial phase change to coolant vapor to form exhaust coolant. The exhaust coolant is then transferred via the return line 52 to the thermal conditioning unit 56 which thermally conditions the exhaust coolant down to a desired temperature. The thermal conditioning unit 56 transfers the heat externally of the server room or other room where the heat producing devices 12 are located. The cooled liquid coolant is then returned to the inlet of the heat exchanger 30 where the process is repeated.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims (and their equivalents) in which all terms are meant in their broadest reasonable sense unless otherwise indicated. Any headings utilized within the description are for convenience only and have no legal or limiting effect.

We claim:

1. An electronics equipment heat exchanger system, comprising:
    a support unit, wherein said support unit includes an air inlet to allow air to enter said support unit and an air outlet to allow air to exit;
    an electronic device attached to said support unit;
    a heat exchanger having an inlet and an outlet, wherein said heat exchanger is positioned within said support unit to thermally condition heated air within said support unit before said heated air exits through said air outlet;
    a liquid thermal management unit fluidly connected to said outlet of said heat exchanger, wherein said liquid thermal management unit thermally manages at least one heat producing device on said electronic device; and
    a thermal conditioning unit fluidly connected to said inlet of said heat exchanger to provide thermally conditioned liquid coolant to said heat exchanger, wherein said thermally conditioned liquid coolant conducts heat within said heat exchanger from said heated air before entering said liquid thermal management unit.

2. The electronics equipment heat exchanger system of claim 1, including a support rack and wherein said support unit is attached within said support rack.

3. The electronics equipment heat exchanger system of claim 1, wherein said heat exchanger is positioned near said air outlet of said support unit.

4. The electronics equipment heat exchanger system of claim 1, wherein said heat exchanger extends across at least fifty-percent of a width of said support unit.

5. The electronics equipment heat exchanger system of claim 1, including an air moving device to move outside air through said air inlet and through said air outlet of said support unit.

6. The electronics equipment heat exchanger system of claim 5, wherein said air moving device is positioned near said air inlet.

7. The electronics equipment heat exchanger system of claim 5, wherein said air moving device is comprised of a fan.

8. The electronics equipment heat exchanger system of claim 1, wherein said heat exchanger is diagonally positioned within said support unit with a first end positioned closer to said air inlet and a second end positioned closer to said air outlet of said support unit.

9. The electronics equipment heat exchanger system of claim 1, wherein said heat exchanger is comprised of a V-shaped structure.

10. An electronics equipment heat exchanger system, comprising:
   a support rack to support a computer server;
   a heat exchanger having an inlet and an outlet, wherein said heat exchanger thermally conditions air heated by said computer server before the heated air exits said support rack;
   a liquid thermal management unit fluidly connected to said outlet of said heat exchanger, wherein said liquid thermal management unit thermally manages at least one heat producing device of said computer server; and
   a thermal conditioning unit fluidly connected to said inlet of said heat exchanger to provide thermally conditioned liquid coolant to said heat exchanger, wherein said thermally conditioned liquid coolant conducts heat within said heat exchanger from said heated air before entering said liquid thermal management unit.

11. The electronics equipment heat exchanger system of claim 10, wherein said heat exchanger is positioned within a door of said support rack.

12. The electronics equipment heat exchanger system of claim 10, wherein said heat exchanger is positioned near a door of said support rack.

13. The electronics equipment heat exchanger system of claim 10, including an air moving device to move outside air through said air inlet and through said air outlet of said support unit.

14. The electronics equipment heat exchanger system of claim 13, wherein said air moving device is comprised of a fan.

15. An electronics equipment heat exchanger system, comprising:
   a support rack;
   a support unit attached within said support rack, wherein said support unit includes an air inlet to allow air to enter said support unit and an air outlet to allow air to exit;
   an electronic device attached to said support unit;
   a heat exchanger having an inlet and an outlet, wherein said heat exchanger is positioned within said support unit to thermally condition heated air within said support unit before said heated air exits through said air outlet;
   wherein said heat exchanger is positioned within an air flow of said support unit
   wherein said heat exchanger is positioned near said air outlet of said support unit;
   an air moving device attached to said support unit to move outside air through said air inlet and through said air outlet of said support unit;
   a liquid thermal management unit fluidly connected to said outlet of said heat exchanger, wherein said liquid thermal management unit thermally manages at least one heat producing device on said electronic device; and
   a thermal conditioning unit fluidly connected to said inlet of said heat exchanger to provide thermally conditioned liquid coolant to said heat exchanger and fluidly connected to an exhaust port of said liquid thermal management unit to receive heated exhaust coolant, wherein said thermally conditioned liquid coolant conducts heat within said heat exchanger from said heated air before entering said liquid thermal management unit.

16. The electronics equipment heat exchanger system of claim 15, wherein said air moving device is positioned near said air inlet.

17. The electronics equipment heat exchanger system of claim 15, wherein said air moving device is comprised of a fan.

18. The electronics equipment heat exchanger system of claim 15, wherein said heat exchanger is diagonally positioned within said support unit with a first end positioned closer to said air inlet and a second end positioned closer to said air outlet of said support unit.

19. The electronics equipment heat exchanger system of claim 15, wherein said heat exchanger is comprised of a V-shaped structure.

20. The electronics equipment heat exchanger system of claim 15, including at least one baffle to direct air to said heat exchanger.

* * * * *